United States Patent [19]
Ochii

[11] Patent Number: 5,282,162
[45] Date of Patent: Jan. 25, 1994

[54] SEMICONDUCTOR MEMORY DEVICE HAVING CAPACITOR OF THIN FILM TRANSISTOR STRUCTURE

[75] Inventor: Kiyofumi Ochii, Yokohama, Japan
[73] Assignee: Kabushiki Kaisha Toshiba, Kawasaki, Japan
[21] Appl. No.: 704,923
[22] Filed: May 23, 1991
[30] Foreign Application Priority Data
  May 24, 1990 [JP] Japan .................. 2-134937
[51] Int. Cl.$^5$ .......................... G11C 11/40
[52] U.S. Cl. .................. 365/189.01; 307/279; 365/182; 365/187
[58] Field of Search .......... 307/279; 365/182, 187, 365/189.01, 189.08, 189.09

[56] References Cited
U.S. PATENT DOCUMENTS

| | | | |
|---|---|---|---|
| 3,706,079 | 12/1972 | Vadasz et al. | 365/182 |
| 4,545,034 | 10/1985 | Chatterjee et al. | 365/182 |
| 4,592,020 | 5/1986 | Takemae et al. | 365/182 |
| 4,633,438 | 12/1986 | Kume et al. | 365/182 |
| 4,669,062 | 5/1987 | Nakano | 365/189.01 |
| 4,786,954 | 11/1988 | Morie et al. | |
| 4,845,673 | 7/1989 | Chevalier | |
| 4,849,801 | 7/1989 | Honjyo et al. | |
| 4,855,801 | 8/1989 | Kuesters | |

FOREIGN PATENT DOCUMENTS

| | | |
|---|---|---|
| 0329569 | 8/1989 | European Pat. Off. |
| 0001155 | 1/1990 | Japan |
| 0066967 | 3/1990 | Japan |

OTHER PUBLICATIONS

M. Aoki et al., IEEE Journal of Solid State Circuits, vol. 24, No. 5, Oct. 1989, "A 1.5-V DRAM for Battery-Based Applications."

Primary Examiner—John Zazworsky
Attorney, Agent, or Firm—Finnegan, Henderson Farabow, Garrett & Dunner

[57] ABSTRACT

The gate of a transistor Q1 serving as a selection transistor is connected to a word line and the source thereof is connected to a bit line BL. The gate of a transistor Q2 serving as a cell capacitor is connected to the drain of the transistor Q1 and the drain thereof is connected to a pulse generation circuit. Whether an inverted layer is formed in the channel region of the transistor Q2 or not is determined according to the stored data. An inverted layer is formed in the channel region of the transistor Q2 having data "1" stored as storage data. The source of the transistor Q2 is connected to the gate of a transistor Q3. The drain of the transistor Q3 is connected to a pulse generation circuit 11 and the source thereof is connected to the drain of the transistor Q1. The transistor Q2 having an inverted layer formed therein is turned on when a preset voltage is supplied from the pulse generation circuit 11 in the stored data reading operation, and in this case, the transistor Q3 is turned on. Therefore, a current can be supplied to the bit line BL from the pulse generation circuit 11 via the transistor Q3 and the selected transistor Q1.

11 Claims, 8 Drawing Sheets

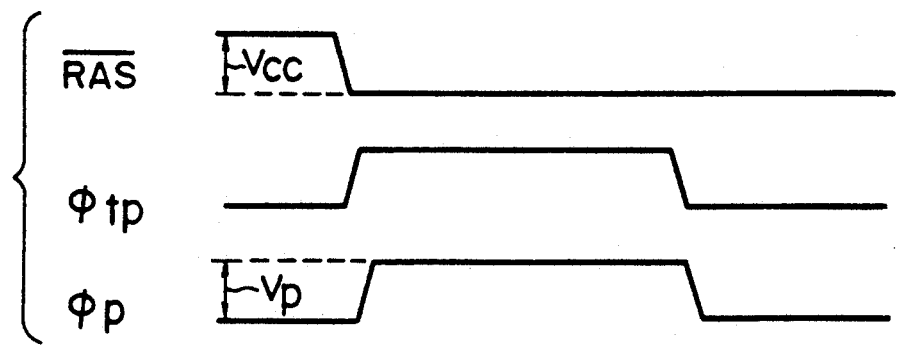
F I G. 6A
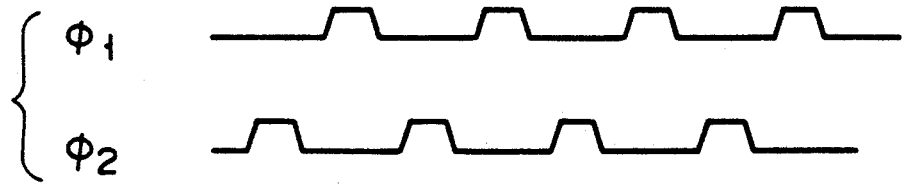
F I G. 6B

SEMICONDUCTOR MEMORY DEVICE HAVING CAPACITOR OF THIN FILM TRANSISTOR STRUCTURE

BACKGROUND OF THE INVENTION

1. Field of the Invention

This invention relates to a memory cell of a DRAM (Dynamic Random Access Memory) of stacked capacitor structure, for example, and more particularly to a semiconductor memory device formed by utilizing a thin film technology.

2. Description of the Related Art

FIG. 8 shows an equivalent circuit of a memory cell of a conventional DRAM having a stacked capacitor structure. The memory cell includes a selection transistor Q1 and a data storing capacitor $C_S$. The gate of the selection transistor Q1 is connected to a word line WL, and one end of the current path of the selection transistor Q1 is connected to a bit line BL and the other end of the current path thereof is connected to the capacitor $C_S$.

FIGS. 9 and 10 show the structure of the above memory cell and portions which are the same as those of FIG. 8 are denoted by the same reference numerals.

In FIGS. 9 and 10, a pair of polysilicon layers 31 and 32 constituting the capacitor $C_S$ are formed above a diffusion layer $n^+$ of the selection transistor Q1. That is, the polysilicon layer 31 is formed in valid contact with the diffusion layer $n^+$ of the selection transistor Q1 and the polysilicon layer 32 serving as a plate electrode which is formed above the polysilicon layer 31 with an insulation film disposed therebetween is biased to a preset potential. The pair of polysilicon layers 31 and 32 are formed to extend over the word line WL partly acting as the gate of the selection transistor Q1 to increase the storage capacitance.

In the DRAM, the number of memory cells connected to the bit line increases and the capacitance associated with the bit line tends to increase with formation of the memory cell of even greater miniaturization. Further, as the miniaturization processing technique has been developed, the occupied area of each cell is reduced. Therefore, the technique for making the insulation film of the capacitor thinner is required to obtain the memory capacitance $C_S$ of a desired value. However, there is a limitation on the technique of reducing the film thickness of the insulation film since it is necessary to maintain the reliability of the capacitor, for example. Therefore, it becomes difficult to attain a desired value of a so-called $C_B/C_S$ ratio which is the ratio of the capacitance $C_B$ of the bit line to the memory capacitance $C_S$ of the cell.

Further, in the LSI of the extremely fine pattern processing generation in the future, it is considered that the power source voltage will be made lower than 5 V. When the power source voltage of the DRAM is lowered, the amount of charge stored in the capacitor is reduced so that the amount of charge transferred to the bit line in the data readout operation will become small. Therefore, it is considered difficult to correctly amplify data by use of a sense amplifier.

Now, the relation between the capacitance $C_B$ of the bit line and the memory capacitance $C_S$ of the cell is explained.

FIG. 11 shows a conventional DRAM including a peripheral circuit and FIG. 12 illustrates the operation of the circuit shown in FIG. 11. The bit line potential $V_{BL}$ is an initial preset potential of the bit line before the readout operation.

First, the readout operation is explained.

(1) Since the equalizing signal EQL is set at a high level before the active cycle is started the bit lines BL0 to BL3 are precharged to a potential of $V_{BL}$ level.

(2) A word line WL0 is selected by a row decoder (not shown) and the potential of the word line WL0 is raised to 7.5 V which is higher than Vcc (=5 V) by means of a bootstrap circuit (not shown).

(3) Dummy word lines DWL0 and /DWL0 (/ indicates an inverted form) corresponding to the selected word line are selected, and the potential of the dummy word line DWL0 is set from the $V_{BL}$ level to the Vcc level and the potential of the dummy word line /DWL0 is set from the $V_{BL}$ to the Vss level.

(4) Data "1" stored in the selected cell connected to the bit line BL0 and data "0" stored in the selected cell connected to the bit line BL2 are respectively transferred to the bit lines BL0 and BL2. Assuming that the storage level of data "1" in the memory cell is $V_1$ and the storage level of data "0" is $V_0$, then the potential level $v_1$ of the bit line after the readout of data "1" can be expressed by the following equation (1):

$$v_1 = (V_1 + C_B/C_S \cdot V_{BL})/(1 + C_B/C_S) \quad (1)$$

Also, the potential level $v_0$ of the bit line after the readout of data "0" can be expressed by the following equation (2):

$$v_0 = (V_0 + C_B/C_S \cdot V_{BL})/(1 + C_B/C_S) \quad (2)$$

If $V_1 = 5$ V, $V_0 = 0$ V, $V_{BL} = 2.5$ V, and $C_B/C_S = 15$, then $v_1 = 2.656$ V and $v_0 = 2.344$ V. Since the reference level of the bit lines BL1 and BL3 is $V_{BL} = 2.5$ V, the potential difference $\Delta v$ amplified by the sense amplifier becomes equal to $\Delta v_1 = 0.156$ V at the readout time of data "1" and becomes equal to $\Delta v_0 = 0.156$ V at the readout time of data "0", and thus the potential difference is set to the same value at the readout time of data "1" and "0".

(5) The sense amplifier is activated, the potentials of the bit lines BL0 and BL3 are amplified to the Vcc level, and the potentials of the bit lines BL1 and BL2 are amplified to the Vss level.

(6) The potentials of a pair of bit lines BL0 and BL1 or bit lines BL2 and BL3 selected by a selection signal supplied from a column decoder (not shown) to a column selection line CSL are respectively supplied to output lines DQ and /DQ.

Next, the write-in operation is explained. In the write-in operation, the same steps (1) to (3) as described in the readout operation are effected. After this, in the step (4), write-in potentials supplied to the output lines DQ and /DQ are transferred to the sense amplifier via a column switching transistor selected by means of the column selection line CSL. The potentials of the pair of bit lines are set to the Vcc and Vss levels by means of the sense amplifier and data corresponding to the thus set levels is written into a selected memory cell.

In this case, the equations (1) and (2) can be rewritten as follows.

$$v_1 = V_{BL} + (V_1 - V_{BL})/(1 + C_B/C_S) \quad (3)$$

$$v_0 = V_{BL} + (V_0 - V_{BL})/(1 + C_B/C_S) \quad (4)$$

As is clearly seen from the equations (3) and (4), $v_1$ and $v_0$ become nearer to $V_{BL}$ when the capacitance $C_B$ of the bit line increases and the capacitance $C_S$ of the capacitor decreases with an increase in the memory capacitance and with formation of the memory cell of even greater miniaturization.

Since an amplification reference voltage of the sense amplifier is $V_{BL}$, the potential differences $\Delta v_1$ and $\Delta v_0$ amplified by the sense amplifier are both lowered. Therefore, it becomes difficult to correctly amplify data by use of the sense amplifier.

SUMMARY OF THE INVENTION

An object of this invention is to provide a semiconductor memory device capable of correctly reading out stored data at a high speed irrespective of the ratio $C_B/C_S$ even when the memory capacitance is increased, the memory cell is extremely miniaturized and the operation voltage is lowered.

The above object can be attained by a semiconductor memory device comprising:

a first transistor having a gate connected to a word line and a current path connected at one end to a bit line, for selecting a memory cell;

a second transistor selected by the first transistor, the conduction state thereof being determined according to the stored data;

pulse generation means for supplying a voltage of a preset level to the second transistor at the time of readout of stored data; and a third transistor turned on when the second transistor is turned on so as to permit a current output from the pulse generation means to be supplied to the bit line.

According to a preferred embodiment of this invention, the second transistor connected to the first transistor acts as a cell capacitor and whether or not an inverted layer is formed in the channel region is determined according to the stored data. An inverted layer is formed in the channel region of the second transistor in which data "1" is stored as the stored data, the second transistor in which the inverted layer is formed is turned on when receiving a preset voltage from the pulse generation means at the time of readout of the stored data and at this time the third transistor is turned on. Therefore, since a current can be supplied from the pulse generation means to the bit line via the third transistor and the first transistor which is selected, data can be read out irrespective of the ratio $C_B/C_S$ at a high speed and with a large margin.

Further, since the second and third transistors are formed of thin films and the gate electrode of the third transistor is constitutes the chanel region of the second transistor, the memory cell can be formed with substantially the same occupied area as the conventional memory cell having one transistor and one capacitor.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 6A and 6B are waveform diagrams for illustrating the operation of the circuit shown in FIG. 5;

DETAILED DESCRIPTION OF THE PREFERRED EMBODIMENTS

Figure 10:
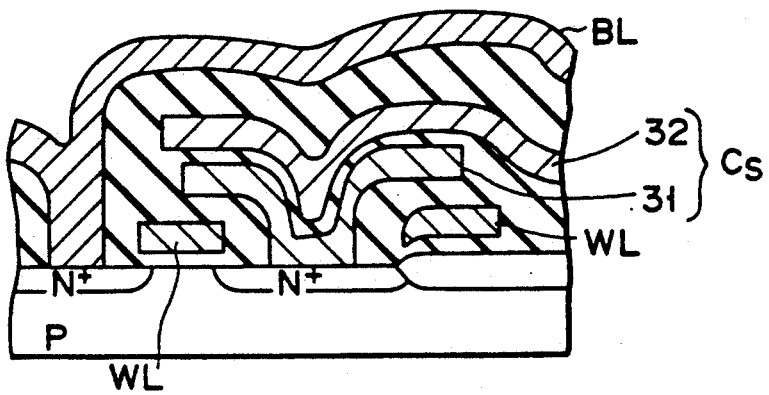
FIG. 10 is a cross sectional view taken along the line 10—10 of FIG. 9.
Figure 11:
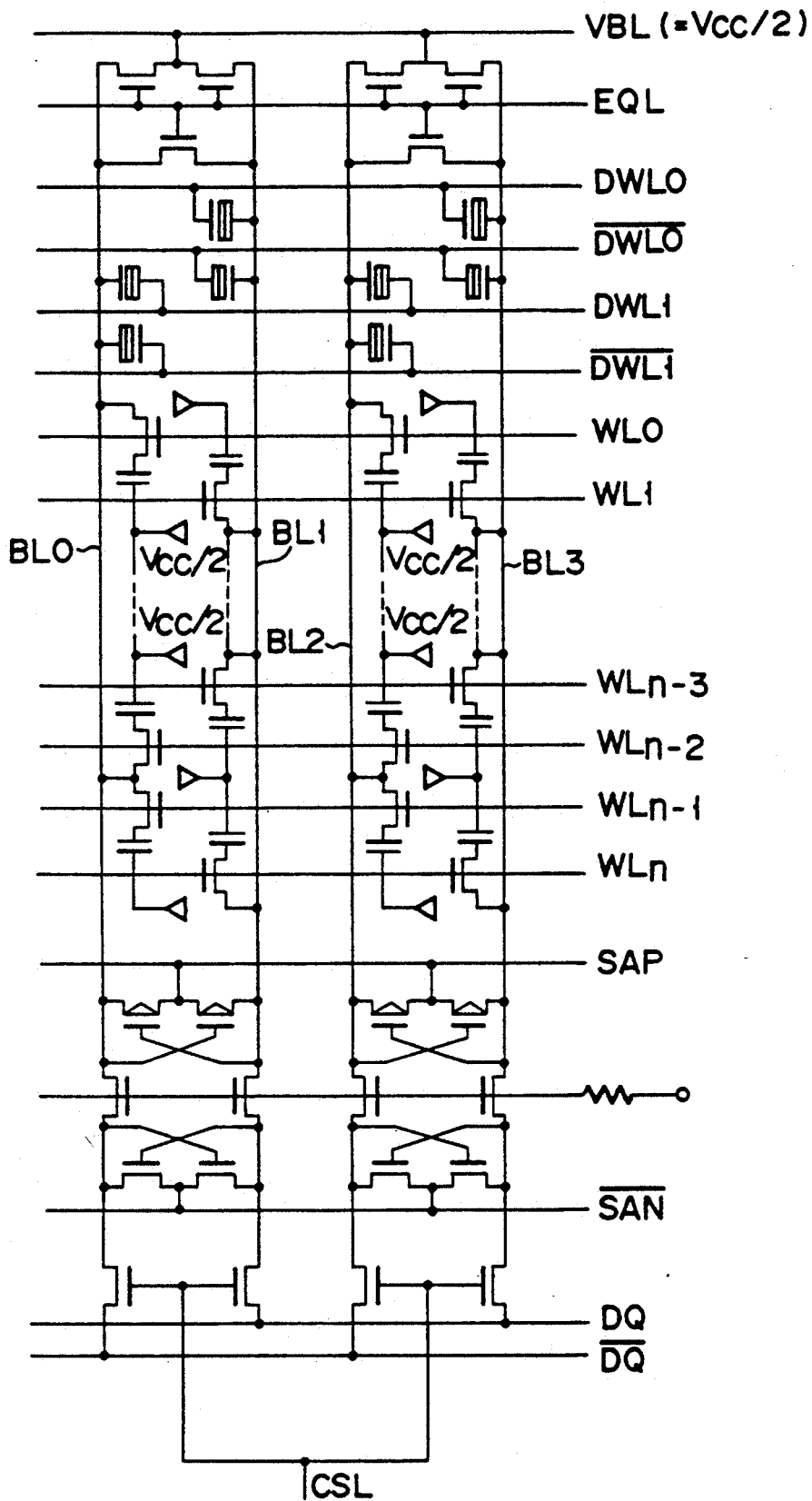
FIG. 11 is a circuit diagram showing a conventional DRAM including a peripheral circuit.
Figure 12:
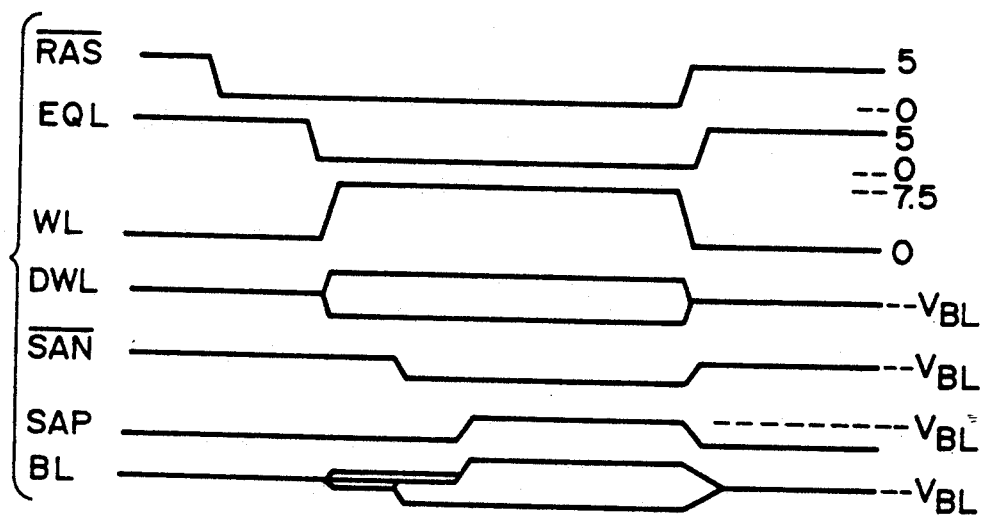
FIG. 12 is waveform diagram for illustrating the operation of the circuit of FIG. 11.

There will now be described an embodiment of this invention with reference to the accompanying drawings. Portions which are the same as those of FIG. 10 are denoted by the same reference numerals and only different portions are explained.

Figure 1:
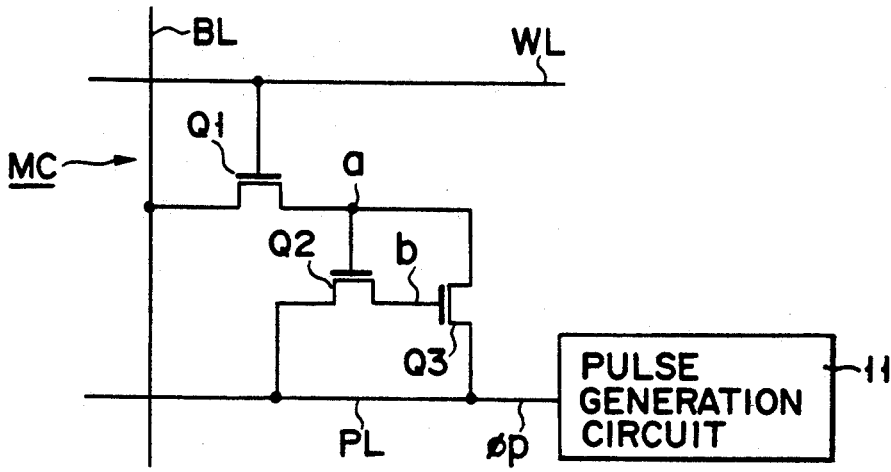
FIG. 1 is an equivalent circuit diagram showing one embodiment of this invention.

FIG. 1 shows an equivalent circuit of a circuit according to a preferred embodiment of this invention and shows one memory cell MC.

For example, the gate of an n-channel selection transistor Q1 is connected to a word line WL and the source of the selection transistor Q1 is connected to a bit line BL. The drain of the selection transistor Q1 is connected to the gate of an n-channel transistor Q2, for example. The drain of the transistor Q2 is connected to a plate electrode PL and the source thereof is connected to the gate of an n-channel transistor Q3, for example. The transistor Q3 is used to drive a current in the bit line and the drain of the transistor Q3 is connected to the plate electrode PL and the source thereof is connected to the drain of the transistor Q1 and the gate of the transistor Q2. The plate electrode PL is connected to a pulse generation circuit 11. The pulse generation circuit 11 outputs a plate pulse $\phi p$ for raising the potential of the plate electrode PL in the data readout operation.

The gate of the transistor Q2 constitutes a storage node of a memory cell, and an inverted layer is formed in the channel region of the transistor Q2 when data "1" is stored in the storage node. On the other hand, when data "0" is stored in the storage node, no inverted layer is formed in the channel region of the transistor Q2.

Figure 2:
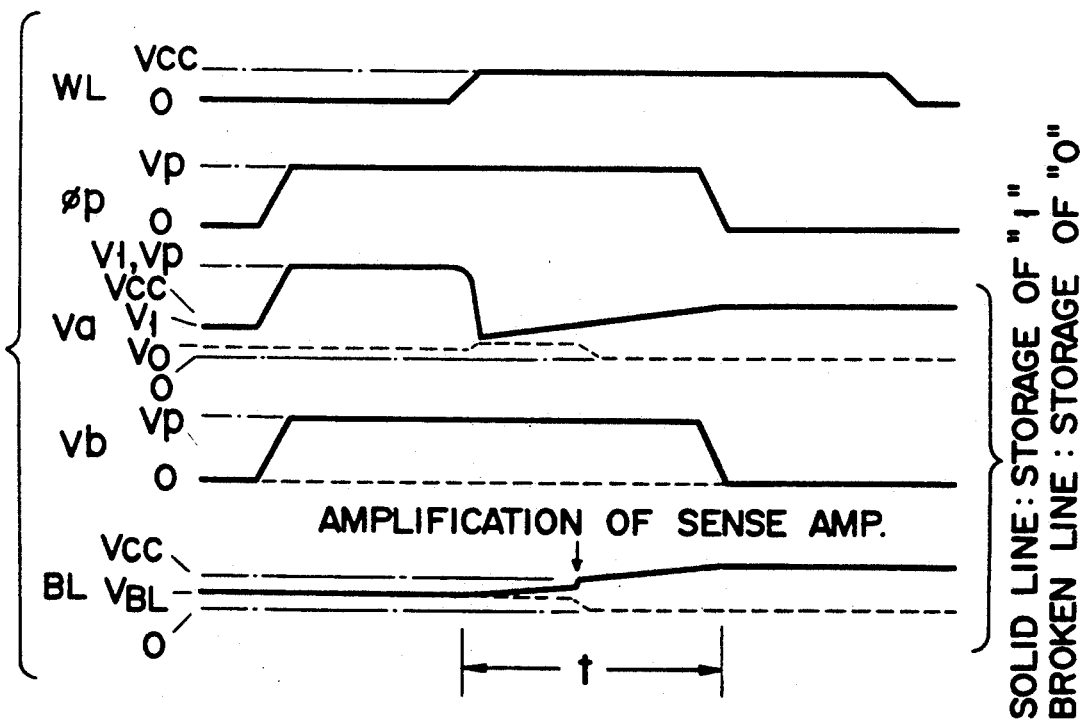
FIG. 2 is a waveform diagram for illustrating the operation of the circuit shown in FIG. 1.

The operation principle of the circuit with the above construction is explained below by referring to FIG. 2.

When data stored in the transistor Q2 is read out, a plate pulse $\phi p$ of a voltage Vp is output from the pulse generation circuit 11 before the word line WL is selected. The voltage Vp is set to be higher than a power source voltage Vcc. When data "1" is stored, the transistor Q2 is set in the ON state and the gate potential is set at V1, for example. Since the gate of the transistor Q2 is capacitively coupled with the plate electrode PL, the potential Va of a connection node a between the drain of the transistor Q1 and the gate of the transistor Q2 is raised to a level of (V1+Vp) when the plate pulse $\phi p$ is output. When the potential Va of the connection node a is raised to (V1+Vp), the potential Vb of a connection node b between the source of the transistor Q2 and the gate of the transistor Q3 is set to (V1+Vp−$V_{th2}$). In this case, $V_{th2}$ denotes the threshold voltage of the transistor Q2. Since the potential Vb is supplied to the gate of the transistor Q3, the transistor Q3 is turned on and the potential Va of the connection node a is set to a lower one of (V1+Vp−$V_{th2}$−$V_{th3}$) and the level of the plate pulse $\phi p$. In this case, $V_{th3}$ denotes the threshold voltage of the transistor Q3 and FIG. 2 shows a case wherein the potential Va of the connection node a is set equal to the plate pulse $\phi p$.

Since an inverted layer is not formed in the channel region when data "0" is stored in the transistor Q2, the potentials Va and Vb of the connection nodes a and b will not vary even when a plate pulse $\phi p$ is supplied to the transistor Q2. The potential of the bit line BL is set to an initial value of $V_{BL}$.

Next, when the word line WL is activated and the transistor Q1 is selected, the connection node a and the bit line BL are connected through the transistor Q1. When data "1" is stored in the transistor Q2, the charge of the connection node a is transferred to the bit line BL and the potential of the bit line BL is set to a value expressed by the equation (1). On the other hand, when data "0" is stored in the transistor Q2, the potential of the bit line BL is set to a value expressed by the equation (2).

Further, since the transistor Q3 is turned on as described above when data "1" is read out, a current is permitted to flow from the pulse generation circuit 11 to the bit line BL via the transistors Q3 and Q1. Therefore, the connection node a and the bit line BL are charged with a constant inclination.

Next, when a preset period of time has passed after the word line WL is selected, a sense amplifier (not shown) is operated to amplify a voltage read out and transferred to the bit line.

In this embodiment, the potential level of the bit line set when data "1" is read out is raised to a level which is higher than the bit line potential $V_{BL}$ by a current supplied from the transistor Q3. Therefore, it is possible to obtain data of a preset level without using a sense amplifier.

After this, the plate pulse $\phi p$ is terminated while the word line WL is being selected. As a result, the potential Vb of the connection node b of the transistor Q2 in which data "1" is stored becomes 0 V, thereby turning off the transistor Q3 to interrupt the current supply to the bit line BL. Therefore, the transistor Q3 supplies a current to the bit line BL for a period of time from the time that the word line WL is selected until the plate pulse $\phi p$ is terminated, that is, for a period of time t shown in FIG. 2.

The condition for ensuring that the potential of the connection node a will not be raised to a level which is higher than the "0" storing level by the capacitive coupling in a case wherein data "0" is stored in the transistor Q2 is $V_0 < V_{th2}$, if the "0" storing level of the connection node a is $V_0$. The "0" storing level becomes closer to the bit line potential $V_{BL}$ while the word line is being selected, but at this time, the transistor Q2 must be turned off. For this reason, the threshold voltage of the transistor Q2 and the bit line potential $V_{BL}$ must be set to satisfy the condition that $V_{th2} > V_{BL}$.

Further, the plate voltage Vp is kept at 0 V in the data write-in operation, the transistor Q3 will not be turned on.

Figure 3:
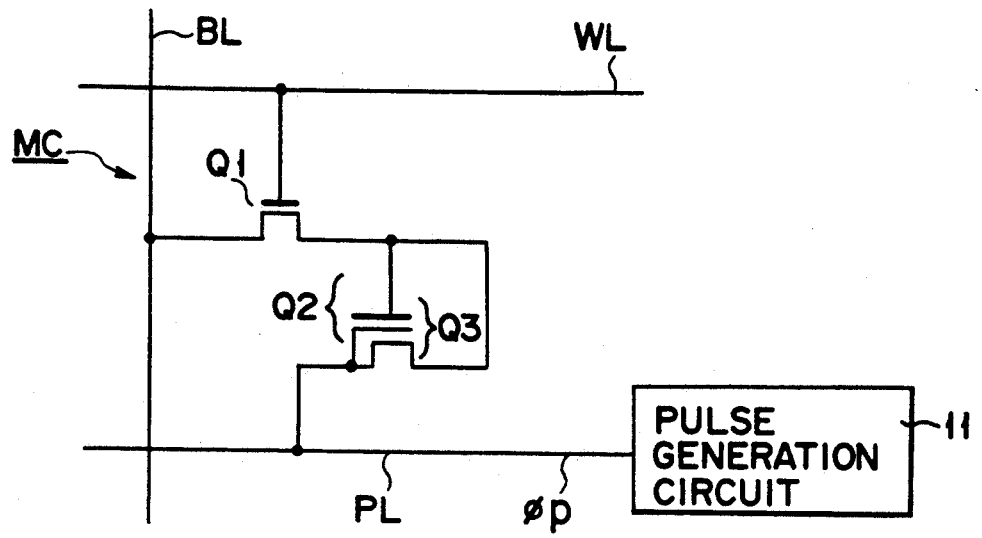
FIG. 3 is an equivalent circuit diagram showing a second embodiment of this invention.

FIG. 3 shows an equivalent circuit obtained when the transistors Q2 and Q3 shown in FIG. 1 are each formed of a thin film transistor (TFT).

That is, the transistors Q2 and Q3 are formed in a laminated structure and the source/drain region of the transistor Q2 and the gate of the transistor Q3 are commonly used.

Figure 4:
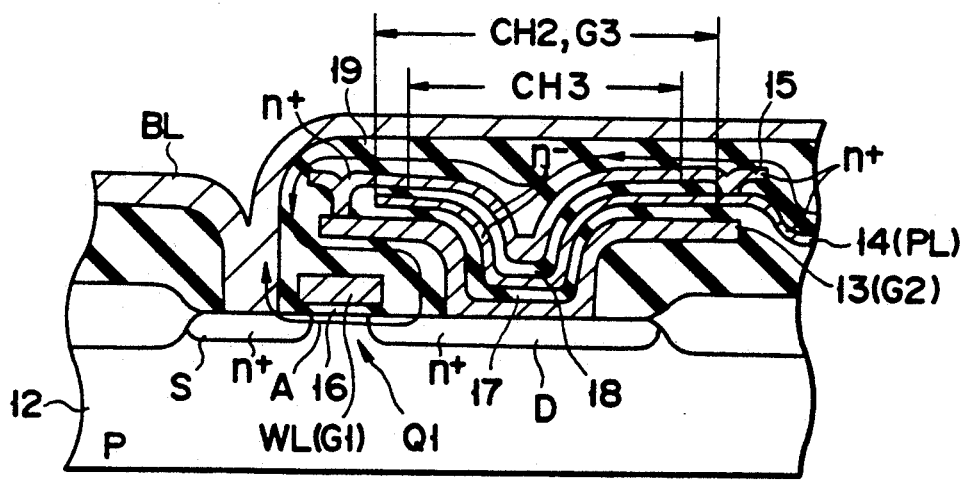
FIG. 4 is a cross sectional view showing the construction of a cell shown in FIG. 3.

FIG. 4 shows a cross section of a cell having the equivalent circuit shown in FIG. 3. The transistors Q2 and Q3 are formed on a diffused layer of the selection transistor Q1. That is, a source S and a drain D constituting the n-channel transistor Q1 are formed in a p-type semiconductor substrate 12. An oxide film 16 is formed on the semiconductor substrate 12 and a gate G1 is formed as a word line WL on the oxide film 16. A thin polysilicon film 13 constituting a gate G2 of the transistor Q2 is formed on the drain D of the transistor Q1. An insulation film 17 is formed on the upper portion of the thin polysilicon film 13 and a thin polysilicon film 14 is formed on the insulation film 17. A channel region CH2 of the transistor Q2, an n⁻-type region of low impurity concentration constituting a gate G3 of the transistor Q3 and an n⁺-type region of high impurity concentration constituting the plate electrode PL are formed in the thin polysilicon film 14. Further, the thin polysilicon films 13 and 14 and the insulation film 17 are combined to constitute a cell capacitor.

An insulation film 18 is formed above the thin polysilicon film 14 and a thin polysilicon film 15 is formed on the insulation film 18. An n⁻-type region of low impurity concentration constituting a channel region CH3 of the transistor Q3 and n⁺-type regions of high impurity concentration constituting the source and drain are formed in the thin polysilicon film 15. One end of the thin polysilicon film 15 is connected to the thin polysilicon film 13 and the other end thereof is connected to the plate electrode PL of the thin polysilicon film 14.

A bit line BL is formed over the above structure with an insulation film 19 disposed therebetween and the bit line BL is connected to the source S of the transistor Q1. When data "1" stored in the gate G2 acting as the storage node is read out in the device shown in FIG. 4, a current supplied to the plate electrode PL flows into the bit line BL via the thin polysilicon films 15 and 13 and the drain and source of the transistor Q1 as indicated by an arrow A shown in FIG. 4.

Figure 5:
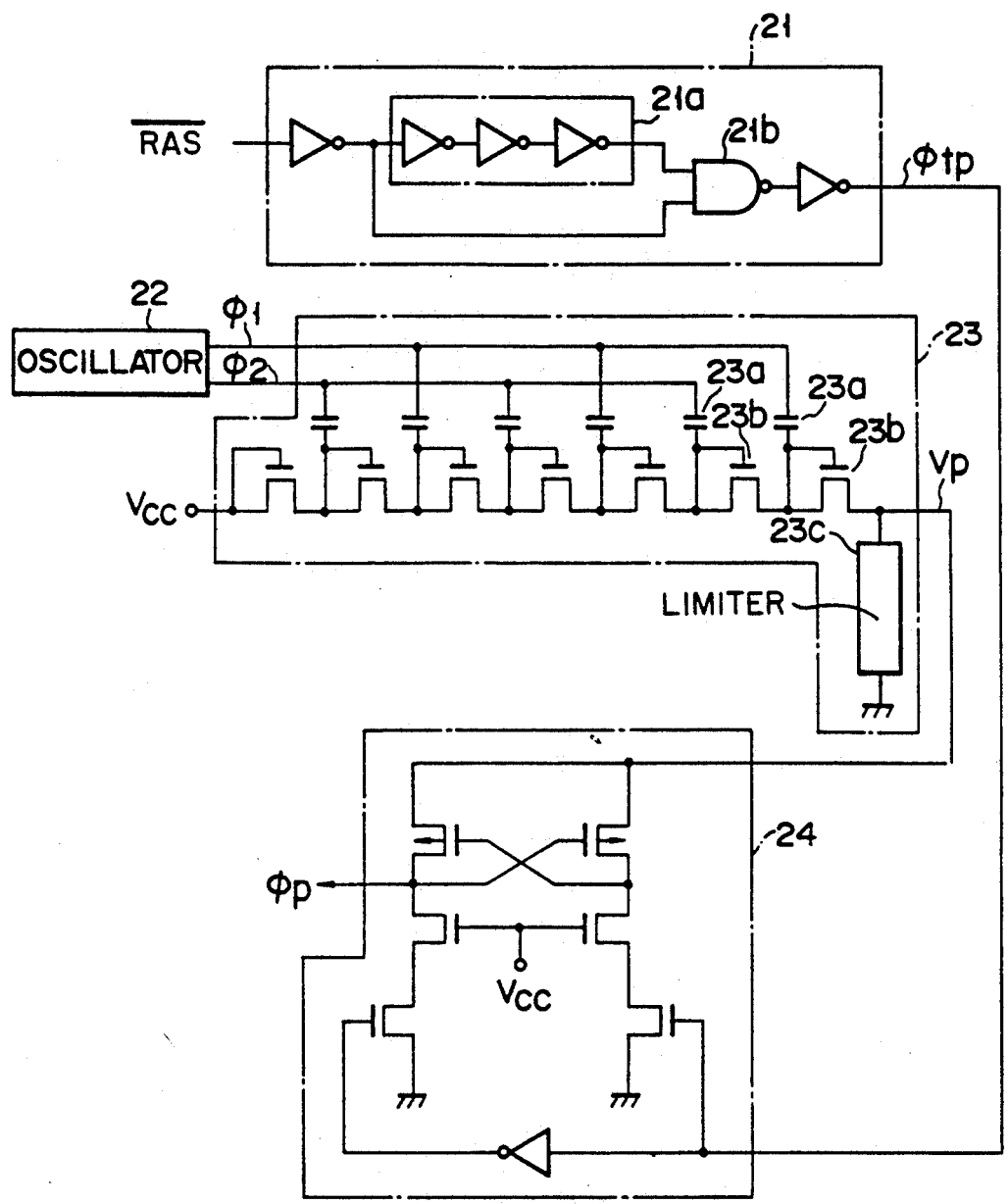
FIG. 5 is a circuit diagram showing an example of a pulse generation circuit shown in FIG. 1.

FIG. 5 shows an example of the pulse generation circuit 11 and FIGS. 6A and 6B shows signals at various portions of the circuit. The pulse generation circuit 11 raises the potential of the plate electrode before the selection transistor is selected in the stored data reading operation and lowers the potential of the plate electrode before selection of the selection transistor is ended.

That is, the pulse generation circuit 11 includes a timing pulse generating circuit 21 for generating a pulse signal $\phi tp$ for a preset period of time in response to the fall of a RAS (Row Address Strobe), a booster circuit 23 for raising a power source voltage Vcc to a preset voltage Vp according to pulse signals $\phi_1$ and $\phi_2$ which are generated from an oscillator 22 and are different from each other in phase by 90°, and an output circuit 24 for outputting the voltage Vp output from the booster circuit 23 as a plate signal $\phi p$ in response to the pulse signal φtp output from the timing pulse generating circuit 21.

The timing pulse generating circuit 21 mainly includes a delay circuit 21a and a NAND circuit 21b, and generates a pulse signal φtp in response to the fall of the RAS. That is, when the RAS is at a high level, an output of the timing pulse generating circuit 21 is set to a low level. Further, when the RAS is set to a low level, the timing pulse generating circuit 21 generates a timing pulse signal φtp. The pulse signal φtp has a pulse width corresponding to the delay time determined by the delay circuit 21a.

The oscillator circuit 22 generates pulse signals $\phi_1$ and $\phi_2$ which are different from each other in phase by 90° and the pulse signals $\phi_1$ and $\phi_2$ are supplied to capacitors constituting the booster circuit 23.

The booster circuit 23 includes a plurality of capacitors 23a, a plurality of transistors 23b which are connected in a diode configuration and a limiter 23c, and raises the power source voltage Vcc by use of the capacitors and the plurality of transistors 23b according to the pulse signals $\phi_1$ and $\phi_2$ so as to create a preset voltage Vp by means of the limiter 23c.

The output circuit 24 outputs a voltage Vp output from the booster circuit 23 as a plate pulse φp in response to a pulse signal φtp output from the timing pulse generation circuit 21. That is, since the pulse signal φtp is set at a low level when the RAS is at a high level, an output of the booster circuit 23 is not selected in the output circuit 24 and the plate pulse φp is set at a low level. Further, when the RAS is set to a low level, the pulse signal φtp is set to a high level and an output of the booster circuit 23 is selected by the output circuit 24 and the voltage Vp is output as the plate pulse φp. The pulse width of the plate pulse φp corresponds to the delay time set in the timing pulse generating circuit 21.

According to the above embodiment, when data "1" is stored in the transistor Q2 constituting the cell capacitor, an inverted layer is formed in the channel region CH2. Therefore, when the potential of the plate electrode PL is raised in the data readout operation, the transistor Q2 is turned on and the transistor Q3 is turned on, and a current can be supplied to the bit line BL from the pulse generation circuit 11 via the transistors Q3 and Q1 when the transistor Q1 is selected. As a result, the operation margin of the sense amplifier can be greatly improved.

Further, since the amount of transfer charges to the bit line is increased, data can be read out at a high speed irrespective of the ratio $C_B/C_S$ even when the DRAM is formed with a large capacity in an extremely fine pattern and the power source voltage is lowered to a level equal to or lower than 5 V.

Further, the transistors Q2 and Q3 are formed in a laminated structure by use of the thin film technique and the gate of the transistor Q3 and the channel region of the transistor Q2 are commonly used. Therefore, the occupied area of a cell can be made equal to or smaller than that in the conventional DRAM having one transistor and one capacitor.

In addition, the pulse generation circuit 13 raises the potential of the plate electrode only for a short period of time in the data readout operation. Thus, since the potential of the plate electrode is not always raised unlike the conventional case, deterioration of the gate oxide film can be prevented, thereby enhancing the reliability.

Further, since a current is supplied to the bit line via the transistors Q3 and Q1 in the stored data reading operation, the soft error rate can be improved.

The thin films 13 and 14 are formed of polysilicon but they can be formed of amorphous silicon.

Further, the thin films 13 and 14 can be formed of single crystal silicon. In this case, it is not necessary to form them in a thin film structure.

In the above embodiments, the transistors Q2 and Q3 are formed in the stacked structure, but this invention is not limited to this, and they can be formed in a trench structure or a combination of the stacked structure and trench structure.

Figure 7:
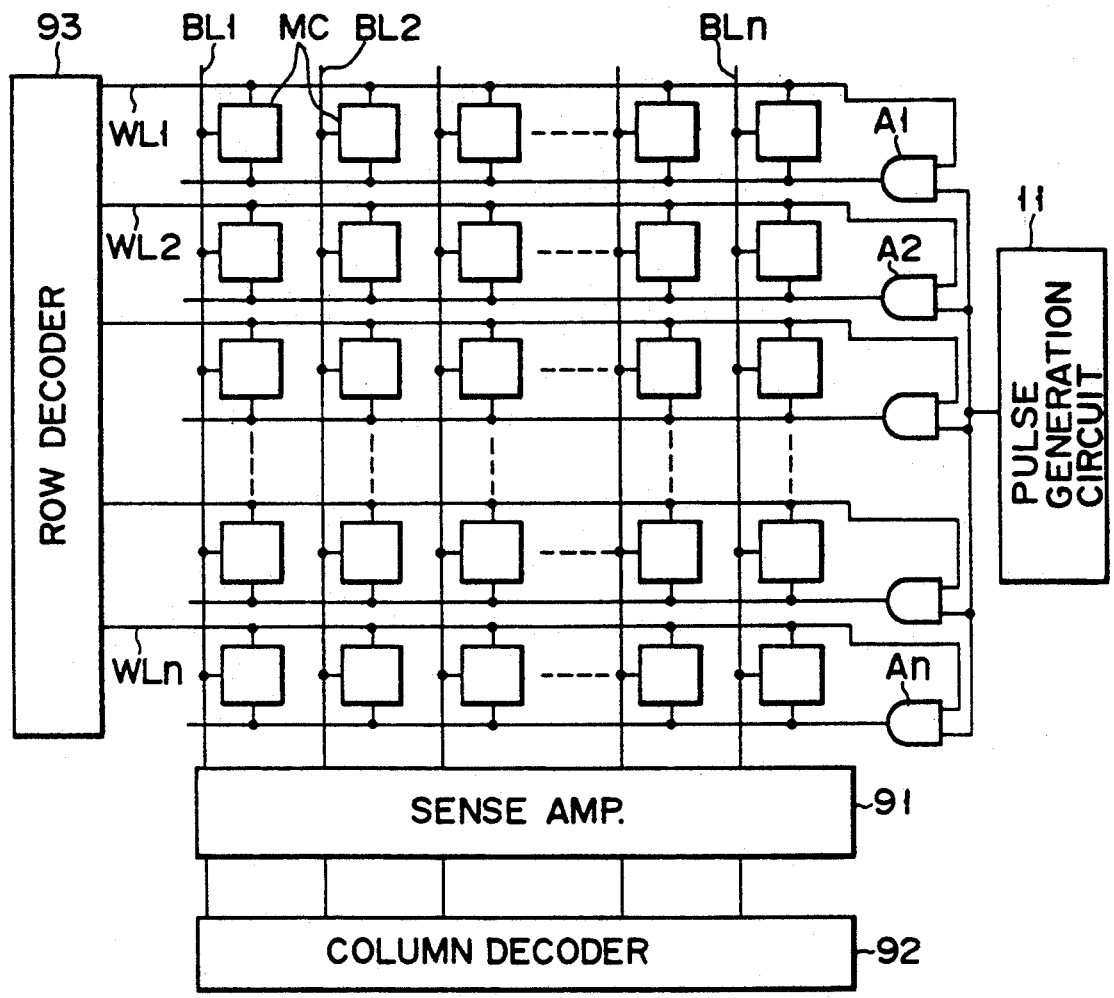
FIG. 7 is a circuit diagram according to a third embodiment of this invention.
Figure 8:
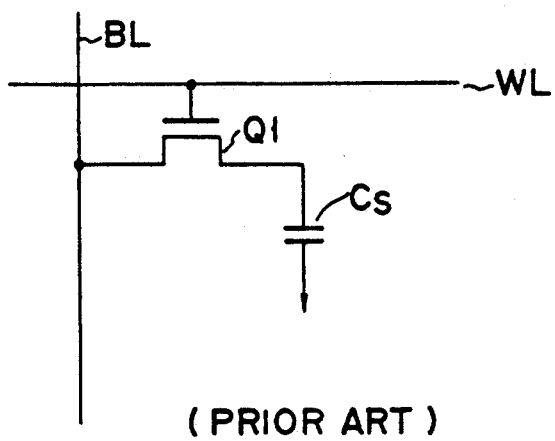
FIG. 8 is an equivalent circuit diagram showing showing a memory cell of a conventional DRAM.
Figure 9:
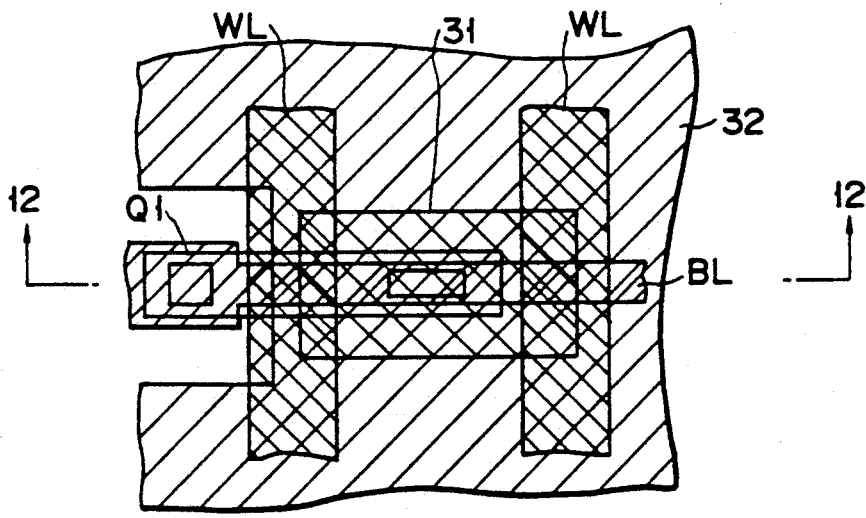
FIG. 9 is a plan view showing the construction of a memory cell shown in FIG. 8.

FIG. 7 shows a third embodiment of this invention, and portions which are the same as those of FIGS. 1 and 3 are denoted by the same reference numerals.

As shown in FIG. 7, memory cells MC are arranged in a matrix form. One-side ends of bit lines BL1 to BLn are connected to a column decoder 92 via a sense amplifier 91. One-side ends of word lines WL1 to WLn are connected to a row decoder 93. The memory cells MC are selected by the column decoder 92 and row decoder 93, and data read out from the memory cell MC is supplied to the sense amplifier 91.

The other side ends of the word lines WL1 to WLn are connected to one-side input terminals of AND circuits A1 to An. The other input terminals of the AND circuits A1 to An are connected to a pulse generation circuit 11. The output terminals of the AND circuits A1 to An are connected to plate electrodes PL1 to PLn.

With the above construction, the AND circuits A1 to An permit pulse signals output from the pulse generation circuit 11 to be supplied to the plate electrodes only when they are enabled by the word lines. Therefore, the pulse generation circuit 11 is only required to drive the memory cells on the row selected by the word line so that the driving ability of the pulse generation circuit 11 can be made small.

This invention is not limited to the above embodiments and can be variously modified without departing from the technical scope thereof.

What is claimed is:

1. A semiconductor memory device having a word line and a bit line, the semiconductor memory device comprising:

a first transistor having a gate coupled to the word line and a current path having a first end coupled to the bit line, and a second end;

a second transistor for storing data, including a control input coupled to the second end of said first transistor, and a current path having first and second ends;

pulse generation means for supplying a voltage pulse to the first end of the current path of said second transistor during a readout of stored data; and a third transistor including a control input coupled to the second end of the current path of said second transistor such as to be responsive to a conduction state of said second transistor, and a current path coupled between said pulse generation means and the second end of the current path of the first transistor.

2. A device according to claim 1, wherein said second and third transistors include a thin film structure and said third transistor has a gate electrode including a channel region of said second transistor.

3. A device according to claim 1, wherein said second and third transistors include polysilicon and the impurity concentration of the channel regions thereof is lower than that of respective remaining portions thereof.

4. A device according to claim 1, wherein said pulse generation means includes an oscillation circuit for generating a pulse signal; a booster circuit for raising a pulse signal generated from said oscillation circuit to a preset potential; and a supply circuit for supplying the preset potential from said booster circuit to said second transistor before said first transistor is selected during the readout of stored data and interrupting supply of the potential to said second transistor while said first transistor is selected.

5. A semiconductor memory device having a word line and a bit line, the semiconductor memory device comprising:
   a first transistor having a gate coupled to the word line and a current path having a first end coupled to the bit line, and a second end;
   a second transistor for storing data, including a gate coupled to the second end of said first transistor, and a current path having a first end and a second end;
   pulse generation means coupled to the first end of the current path of said second transistor, for supplying a voltage pulse to said second transistor during a readout of stored data; and
   a third transistor having a gate coupled to the second end of the current path of said second transistor, and a current path having a first end coupled to the second end of the current path of said first transistor and a second end coupled to said pulse generation means.

6. A device according to claim 5, wherein said second and third transistors include a thin film structure and said third transistor has a gate electrode including a channel region of said second transistor.

7. A device according to claim 5, wherein said second and third transistors include polysilicon and the impurity concentration of the channel regions thereof is lower than that of the respective remaining portions thereof.

8. A device according to claim 5, wherein said pulse generation means includes an oscillation circuit for generating a pulse signal; a booster circuit for raising a pulse signal generated from said oscillation circuit to a preset potential; and a supply circuit for supplying the preset potential from said booster circuit to said second transistor before said first transistor is selected during the readout of stored data and interrupting supply of the potential to said second transistor while said first transistor is selected.

9. A semiconductor memory device having a word line and a bit line, the semiconductor memory device comprising:
   a first transistor having a gate coupled to the word line and a current path having a first end coupled to the bit line, and a second end;
   a second transistor for storing data, including a control input coupled to the second end of said first transistor, and a current path having first and second ends;
   pulse generation means for supplying a voltage pulse to the first end of the current path of said second transistor during a readout of stored data;
   a third transistor including a control input coupled to the second end of the current path of said second transistor such as to be responsive to a conduction state of said second transistor, and a current path coupled between said pulse generation means and the second end of the current path of the first transistor; and
   supplying means for supplying a pulse signal from said pulse generation means to said second and third transistors in response to a selection signal.

10. A device according to claim 9, wherein said supplying means includes an AND circuit.

11. A semiconductor memory device having a word line and a bit line, the semiconductor memory device comprising:
   a first transistor having a gate coupled to the word line, and a first current path having a first end coupled to the bit line and a second end;
   a second transistor having a gate coupled to the second end of the current path of the first transistor, and a second current path having a first end and a second end, said gate serving as a storage node for storing data, and said second current path being conductive when the data is stored in said gate;
   pulse generation means for generating a pulse signal, and for supplying the pulse signal to the first end of the second current path during a readout of the stored data; and
   a third transistor including a gate coupled to the second end of the second current path such as to be responsive to a conduction state of said second transistor, and a third current path coupled between said pulse generation means and the second end of the first current path.

* * * * *